United States Patent
Shakuda

[11] Patent Number: 6,087,681
[45] Date of Patent: *Jul. 11, 2000

[54] GAN SEMICONDUCTOR LIGHT EMITTING DEVICE HAVING A GROUP III-V SUBSTRATE

[75] Inventor: Yukio Shakuda, Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/149,435

[22] Filed: Sep. 8, 1998

Related U.S. Application Data

[62] Division of application No. 08/517,121, Aug. 21, 1995, Pat. No. 5,838,029.

[30] Foreign Application Priority Data

| Aug. 8, 1994 | [JP] | Japan | 6-196852 |
| Aug. 26, 1994 | [JP] | Japan | 6-202478 |
| Aug. 26, 1994 | [JP] | Japan | 6-202480 |
| Aug. 26, 1998 | [JP] | Japan | 6-202481 |

[51] Int. Cl.[7] ................................ H01L 33/00
[52] U.S. Cl. ................ 257/103; 257/94; 257/615; 257/627
[58] Field of Search ............... 257/94, 96, 103, 257/627, 628, 615

[56] References Cited

U.S. PATENT DOCUMENTS

| 4,147,584 | 4/1979 | Garrison et al. ............ 156/612 |
| 4,890,293 | 12/1989 | Taneya et al. . |
| 5,192,987 | 3/1993 | Khan et al. ............ 257/183.1 |
| 5,210,767 | 5/1993 | Arimoto et al. . |
| 5,218,613 | 6/1993 | Serreze . |
| 5,247,533 | 9/1993 | Okazaki et al. ............ 257/13 |
| 5,578,839 | 11/1996 | Nakamura et al. ......... 257/96 |
| 5,587,014 | 12/1996 | Iyechika et al. ............ 117/90 |
| 5,657,335 | 8/1997 | Rubin et al. ............ 257/103 |
| 5,689,123 | 11/1997 | Major et al. ............ 257/18 |
| 5,767,581 | 6/1998 | Nakamura et al. ......... 257/86 |

FOREIGN PATENT DOCUMENTS 477 013 A2  3/1992  European Pat. Off. .

OTHER PUBLICATIONS

Abstract of Japanese Patent Publ. No. 2–129915 dated May 7, 1992, Tsunoda et al.

Primary Examiner—Minh Loan Tran
Attorney, Agent, or Firm—Arent Fox Kintner Plotkin & Kahn, PLLC

[57] ABSTRACT

A light emitting device employing gallium nitride type compound semiconductor which generates no crystal defect, dislocation and can be separated easily to chips by cleavage and a method for producing the same are provided. As a substrate on which gallium nitride type compound semiconductor layers are stacked, a gallium nitride type compound semiconductor substrate, a single-crystal silicon, a group II-VI compound semiconductor substrate, or a group III-IV compound semiconductur substrate is employed.

5 Claims, 9 Drawing Sheets

GAN SEMICONDUCTOR LIGHT EMITTING DEVICE HAVING A GROUP III-V SUBSTRATE

This is a div of Ser. No. 08/517,121 filed Aug. 21, 1995 now U.S. Pat. No. 5,838,029.

BACKGROUND OF THE INVENTION

The present invention relates to a semiconductor light emitting device and a method for producing the same, and more particularly, a semiconductor light emitting device comprising a gallium nitride type compound semiconductor for emission of blue light and a method for producing the same.

Such a gallium nitride type compound semiconductor is (1) a semiconductor comprising a compound of Ga of group III element and N of group V element, or (2) a semiconductor which comprises a GaN compound in which a part of Ga is substituted by other group III elements such as Al or In and/or a part of N is substituted by other group V elements such as P or As.

The semiconductor light emitting devices include light emitting diodes (hereinafter referred to as "LED") having pn junctions or double heterojunctions such as pin junctions, super-luminescent diodes (hereinafter referred to as "SLD"), and semiconductor laser diodes (hereinafter referred to as "LD").

Although conventional blue LEDs are lower in luminance than red or green ones and disadvantageous for practical use, they have been improved by using gallium nitride type compound semiconductor and more specifically, doping an amount of Mg thus forming a p-type semiconductor layer with a low resistance and are now available for new applications.

A conventional gallium nitride LED has a structure shown in FIG. 7. It is fabricated by applying gaseous forms of metal organic compounds such as trimethylgallium (TMG) and ammonia ($NH_3$) together with a carrier of $H_2$ gas to a single-crystal substrate 51 of sapphire ($Al_2O_3$) at a low temperature of 400° C. to 700° C. using a metal organic chemical vapor deposition (MOCVD) method to form a low-temperature buffer layer 54 of, approximately 0.01 to 0.2 micrometer thick, comprising GaN, and applying the gaseous forms of the same materials at a high temperature of 700° C. to 1200° C. to form a high-temperature buffer layer 55, approximately 2 to 5 micrometers thick, comprising n-type GaN which is identical in the chemical composition to the layer 54.

A gaseous form of trimethylaluminum (TMA) is then added to the prescribed materials to deposit an n-type cladding layer 56 of, approximately 0.1 to 0.3 micrometer thick, comprising $Al_xGa_{1-x}N$ (where 0<x<1) for creating a double heterojunction. Those n-type layers are prepared by depending on the fact that gallium nitride type compound semiconductor materials can be made n-type without addition of any n-type impurities or by simultaneous application of $SiH_4$ gas.

Then, the same materials including a less amount of Al and a more amount of In than in the cladding layers are deposited to form an active layer 57 which is comprising, for example, $Ga_yIn_{1-y}N$ (where 0<y≦1) and lower in band gap energy than the cladding layers.

Also, a p-type impurity of Mg or Zn in the form of a metal organic compound gas of e.g. bis(cyclopentadienyl) magnesium ($CP_2Mg$) or dimethylzinc (DMZn) is added to the same gaseous materials as of the n-type cladding layers in a reaction tube to form a p-type cladding layer 58 comprising p-type $Al_xGa_{1-x}N$.

Furthermore, the same gaseous materials are applied for vapor deposition of a p-type GaN cap layer 59.

Whole surfaces of growth layers of the semiconductor material is then coated with a protective layer of e.g. $SiO_2$ and the like and annealed for approximately 20 to 60 minutes at a temperature ranging from 400° C. to 800° C., allowing both the p-type cap layer 59 and the p-type cladding layer 58 to be activated. After the protective layer is removed, a resist pattern is applied for assigning n-type electrodes. When the semiconductor layers are subjected to dry etching by chlorine plasma atmosphere, desired regions of the n-type GaN high-temperature buffer layer 55 are exposed as shown in FIG. 7. Finally, two electrodes 61 and 60 are formed by sputtering of a metal film such as Au or Al. The semiconductor layers are then diced to LED chips.

As understood, a conventional semiconductor light emitting device using the gallium nitride type compound semiconductor material has at back side a sapphire substrate made of an insulating material. For forming electrodes on the back side, it is hence needed to use etching or other complicated processing method.

Although the sapphire substrate withstands a high temperature and is easily bonded to any type of crystal surface, the sapphire is very different from the gallium nitride semiconductor Al in lattice constant, 4.758 (sapphire substrate) angstrom to 3.189 (gallium nitride type semiconductor crystal) angstrom, and also, in coefficient of thermal expansion. The difference in lattice constant may result in crystal defect or dislocation in the buffer layer stacked on the sapphire substrate as denoted by A in FIG. 8. If the crystal defect propagates to the single-crystal gallium nitride type compound semiconductor layers which are stacked on the buffer layer and act as operating layers, operating region is declined and also optical characteristics of the semiconductor layers degrade.

In addition, the sapphire substrate is hardly cleft and it is thus not easy to produce semiconductor light emitting device chips by cleaving above-mentioned structure of the semiconductor layers. It is said that the conventional semiconductor layer structure described above is not appropriated for producing particular devices such as semiconductor laser devices in which two opposite sides are required to be mirror surfaces which are parallel with each other at high accuracy. It is also hard to process the sapphire substrate which may thus be processed with much difficulty.

SUMMARY OF THE INVENTION

It is an object of the present invention to provide an improved semiconductor light emitting device and a method for producing the same wherein the above disadvantages are eliminated and the generation of undesirable artifacts including the crystal defect and dislocation which may result from mismatch in lattice constant or thermal expansion coefficient are minimized.

It is a further object of the present invention to provide a semiconductor light emitting device and a method for producing the same, the semiconductor light emitting device having multilayer structure wherein processing like as separating wafers to chips easily by cleaving, for example, is easily performed. Consequently, gallium nitride type compound semiconductor according to the present invention enables to obtain mirror surfaces as end surfaces by cleaving for a semiconductor light emitting device which needs, like semiconductor laser, two mirror surfaces which are parallel with each other as end surfaces of the device.

A semiconductor light emitting device according to the first aspect of the present invention in order to achieve the object comprises a single-crystal silicon substrate, an insulating layer formed on the single-crystal silicon substrate, and gallium nitride type compound semiconductor layers provided on the insulating layer.

It is preferable to employ a single-crystal silicon substrate of which (111) crystal plane is a principal plane, since an insulating layer of which lattice matching with gallium nitride type compound semiconductor layer at an interface between the gallium nitride type compound semiconductor substrate and the insulating layer is appropriate can be obtained.

The gallium nitride type compound semiconductor layers may be a plurality layers including a p-type layer and an n-type layer and an active layer for emission of light. This structure is preferable so as to provide the light emitting device. The gallium nitride type compound semiconductor layers comprises a buffer layer, a lower cladding layer, an active layer, an upper cladding layer, and a cap layer.

The buffer layers are made of n-type GaN, the lower cladding layer is made of n-type $Al_xGa_{1-x}N$ (0<x<1), the active layer is made of $Ga_nIn_{1-n}N$ (0<n≦1), the upper cladding layer is made of p-type $Al_xGa_{1-x}N$ (0<x<1), and the cap layer is made of p-type GaN, thus the light emitting device with double hetero structure can be provided.

A method for producing the semiconductor light emitting device according to the first aspect of the present invention comprises the steps of:

(a) forming an insulating layer on a single-crystal silicon substrate;

(b) forming a gallium nitride type compound semiconductor layer as a buffer layer on the insulating layer;

(c) stacking on the buffer layer in sequence a lower cladding layer, an active layer, an upper cladding layer, and a cap layer, these layers being made of gallium the nitride type compound semiconductor;

(d) exposing a predetermined surface of the buffer layer by etching perpendicularly to the single-crystal silicon substrate;

(e) forming electrodes on both the cap layer and the predetermined surface of the buffer layer exposed by the etching treatment in step (d), whereby obtaining a semiconductor wafer having multilayer structure; and (f) separating the semiconductor wafer to chips by dicing or by cleaving.

According to the first aspect of the present invention, the insulating layer of, for example, silicon nitride or aluminum oxide is deposited on the single-crystal silicon substrate and then, single-crystal gallium nitride type compound semiconductor layers which are operating layers are grown on the gallium nitride type compound semiconductor buffer layers which are on the insulating layer. As a result, the deposited layers on the substrate are similar to one another in lattice constant and coefficient of thermal expansion, thus having less chance of undesirable lattice defect and dislocation.

The buffer layer is provided for preventing crystal defect generated by lattice mismatch between the gallium nitride type compound semiconductor layers and the insulating layer on the single-crystal semiconductor substrate from extending across the single-crystal gallium nitride type compound semiconductor layers which are operating layers and from generating other defect or dislocation. The buffer layer may have a double layer structure including the low-temperature buffer layer and the high-temperature buffer layer to minimize and relax the lattice mismatch efficiently.

Also, since the single-crystal semiconductor layers of the buffer layer and the cladding layer, thickness of each of the buffer layer and the cladding layer being at least one micrometer, are identical to each other in chemical composition, their cleft edges are highly planar in cleft surface, thereby mirror surfaces being easily obtained To achieve the foregoing object, according to the second aspect of the present invention, a gallium nitride type compound semiconductor substrate is employed as the semiconductor substrate and gallium nitride type compound semiconductor layers are stacked on the substrate.

The semiconductor light emitting device according to the second aspect of the present invention comprises gallium nitride type compound semiconductor layers stacked on the gallium nitride type compound semiconductor layers.

A method for producing a semiconductor light emitting device according to the second aspect of the present invention comprises the steps of:

(g) growing a gallium nitride type compound semiconductor layer on a single-crystal semiconductor substrate;

(h) removing the single-crystal semiconductor substrate; and (i) growing single-crystal gallium nitride type compound semiconductor layers including at least both an n-type layer and a p type layer, on the single-crystal gallium nitride type compound semiconductor layer, with utilizing the gallium nitride type compound semiconductor layer as a new substrate.

It is preferable that the single-crystal semiconductor substrate is made of one member of selected from the group consisting of GaAs, GaP, InP and Si and has a (111) crystal plane, for optical and electrical characteristics of the gallium nitride type compound semiconductor layers which are formed thereon.

It is also preferable that the step (g) of growing the gallium nitride type compound semiconductor layer on the single-crystal semiconductor substrate may be implemented by forming the low-temperature buffer layer of the gallium nitride type compound semiconductor layer on the single-crystal semiconductor substrate at low temperature of 400° C. to 700° C. and forming the gallium nitride type compound semiconductor layer at higher temperature of 700° C. to 1200° C. so that the low-temperature buffer layer relaxes the lattice mismatch between the substrate and the low-temperature buffer layer and prevents crystal defect or dislocation.

More preferably, before the step (i) of growing the gallium nitride type compound single-crystal semiconductor layers, the low-temperature buffer layer of the gallium nitride type compound semiconductor is formed at low temperature of 400° C. to 700° C. and then, the high-temperature buffer layer of the gallium nitride type compound semiconductor is formed at high temperature of 700° C. to 1200° C. and is followed by the growing of the single-crystal semiconductor layers of gallium nitride type compound to minimize crystal defect or dislocation produced in the gallium nitride type compound semiconductor substrate.

The single-crystal gallium nitride type compound semiconductor layers including at least both the n-type layer and the p-type layer comprise the n-type cladding layer, the active layer, and the p-type cladding layer, these three layers forming a sandwich structure. In particular, the band gap energy of the active layer is smaller than that of the n-type cladding layer or the p-type cladding layer. Also, the n-type cladding layer, the p-type cladding layer, and high-temperature buffer layer and the gallium type nitride type compound semiconductor substrate are the same in chemical composition, thus providing light emitting device with high efficiency of light emission.

It is preferable that a semiconductor wafer on which the single-crystal gallium nitride type compound semiconductor layers is then cleft to desired chips, thus providing the mirror end surfaces.

According to the second aspect of the present invention, after the gallium nitride type compound semiconductor layer is grown on a single-crystal semiconductor substrate, the single-crystal semiconductor substrate is removed and single-crystal gallium nitride type compound semiconductor layers which are operating layers are provided on the gallium nitride type compound semiconductor layer which is now utilized as a new substrate. The semiconductor layers are similar to one another in lattice constant and coefficient of thermal expansion, thus having less chance of undesirable lattice defect and dislocation.

A crystal defect in the gallium nitride type compound semiconductor layer which is grown on the original single-crystal semiconductor substrate and is utilized as a new substrate may be generated by lattice mismatch between the gallium nitride type compound semiconductor layer which is the new substrate and the single-crystal semiconductor substrate. The crystal defect also may extend across the single-crystal gallium nitride type compound semiconductor layers which are operating layers. Thereby other dislocation or crystal defect may be generated. The crystal defect or dislocation is however prevented by the presence of the low-temperature buffer layer and high-temperature buffer layer provided between the gallium nitride type compound semiconductor layers and the new substrate.

Since the single-crystal semiconductor layers of the buffer layer and the cladding layer, thickness of each of the buffer layer and the cladding layer being at least one micrometer, are identical to each other in chemical composition, their cleft edges are highly planar in cleft mirror surface.

To achieve the foregoing object, the third aspect of the present invention by use of a group II-VI compound semiconductor substrate as a semiconductor substrate.

The semiconductor light emitting device according to the third aspect of the present invention comprises gallium nitride type compound semiconductor layers stacked on a II-VI compound semiconductor substrate.

The gallium nitride type compound semiconductor layers may be stacked on a top surface of the substrate comprising group VI atoms of the group II-VI compound material so that the lattice matching at interface is desirable.

The group II-VI compound semiconductor substrate may be made of ZnSe. When the group II-VI compound semiconductor substrate is made of ZnSe, the substrate does not absorb light with at least 470 nanometer wavelength. When the semiconductor substrate is made of ZnS, the substrate does not absorb light with at least 320 nanometer wavelength. As a result, the light emitting semiconductor device can be provided which has improved efficiency of light emission.

A method for producing the semiconductor light emitting device according to the third aspect of the present invention comprises the steps of:

(j) preparing the group II-VI compound semiconductor substrate;

(k) stacking a buffer layer of gallium nitride type compound semiconductor on a principal plane of the group II-VI compound semiconductor substrate;

(l) stacking on the buffer layer in sequence a lower cladding layer, an active layer, an upper cladding layer, and a cap layer, these layers being made of the gallium nitride type compound semiconductor with matching crystal lattice of each layer to one another;

(m) forming electrodes on both the top of the cap layer and the bottom of the group II-VI compound semiconductor substrate, whereby obtaining a semiconductor wafer having multilayer structure; and (n) cleaving the semiconductor wafer to chips.

Preferably the step of forming the buffer layers comprises steps of forming a low-temperature buffer layer at low temperature and forming a high-temperature buffer layer at high temperature.

According to the third aspect of the present invention, the substrate on which gallium nitride type compound semiconductor layers are grown is made of a group II-VI compound semiconductor such as ZnSe or ZnS. The gallium nitride type compound semiconductor layers are hence similar to the group II-VI compound semiconductor substrate in both lattice constant and coefficient of thermal expansion, having less chance of undesirable crystal defect and dislocation.

Also, the group II-VI compound semiconductor substrate is employed with a top surface comprising the group VI atoms of the group II-VI compound semiconductor substrate, thus decreasing the lattice mismatch to the gallium nitride type compound semiconductor layers. This allows any crystal defect or dislocation to rarely occur into the single-crystal gallium nitride type compound semiconductor layers which are operating layers.

Since the single-crystal semiconductor layers of the buffer layer and the cladding layer, thickness of each of the buffer layer and the cladding layer being at least one micrometer, are identical to each other in chemical composition, their cleft edges are highly planar in cleft surface, thereby mirror surfaces being easily obtained.

According to the fourth aspect of the present invention so as to achieve the prescribed object, a group III-V compound semiconductor substrate is used as a semiconductor substrate.

The semiconductor light emitting device according to the fourth aspect of the present invention comprises gallium nitride type compound semiconductor layers stacked on a group III-V compound semiconductor substrate.

It is preferable that the gallium nitride type compound semiconductor layers are stacked on a top surface of the substrate comprising group V atoms of the group III-V compound material, thus providing a desirable lattice matching at interface.

The group III-V compound semiconductor substrate is preferably made of a member selected from the group consisting of GaAs, InAs, GaP and InP.

A method for producing the semiconductor light emitting device according to the fourth aspect of the present invention comprises the steps of:

(o) preparing the group III-V compound semiconductor substrate;

(p) stacking a buffer layer of gallium nitride type compound semiconductor on a principal plane of the group III-V compound semiconductor substrate;

(q) stacking on the buffer layer in sequence a lower cladding layer, an active layer, an upper cladding layer, and a cap layer, these layers being made of gallium nitride type compound semiconductor substrate, with matching crystal lattice of each layer to one another;

(r) forming electrodes on both the top of the cap layer and the bottom of the group III-V compound semiconductor substrate, whereby obtaining a semiconductor wafer having maltilayer structure;

(s) cleaving the semiconductor wafer to chips.

According to the fourth aspect of the present invention, the substrate on which gallium nitride type compound semiconductor layers are stacked is made of a group III-V compound material such as GaAs, InAs, GaP, or InP. The gallium nitride type compound semiconductor layers are hence similar to the group III-V compound semiconductor substrate in lattice constant and coefficient of thermal expansion, having less chance of undesirable crystal defect and dislocation. In particular, the thermal expansion coefficient of above-mentioned group III-V compound material is approximate to that of GaN as compared with conventional sapphire substrate, and distortion in the lattice will be minimized during the heating process in fabrication process.

Also, the substrate is provided with a plane corresponding to C plane of the sapphire and a top surface comprises the group V atoms of the group III-V compound semiconductor substrate, thus decreasing the lattice mismatch to the gallium nitride type compound semiconductor layers. This allows any crystal defect or dislocation to rarely occur in the single-crystal gallium nitride type compound semiconductor layers which are operating layers. The group V atoms of the group III-V compound semiconductor substrate on the top surface of the substrate promote nitrogenizing on the substrate thus producing optimum alignment of crystalline planes in the gallium nitride type compound semiconductor layers.

Since the single-crystal semiconductor layers of the buffer layer and the cladding layer, thickness of each of the buffer layer and the cladding layer being at least one micrometer, are identical to each other in the chemical composition, their cleft edges are highly planar in cleft surface, therby mirror surfaces being easily obtained.

In addition, when the substrate is made of a proper material comprising group III atoms which are founded in the buffer layer, distortion between the substrate and the buffer layer can be minimized.

DETAILED DESCRIPTION

Example 1

This Example 1 shows an example according to the first aspect of the present invention wherein gallium nitride type compound semiconductor layers are stacked to product on a single-crystal sillicon substrate as a semiconductor substrate on which an insulating layer made of sillicon nitride and the like are provided.

The semiconductor laser and a method for producing the same will be explained in detail referring to FIGS. 1(a) to 1(f).

Figure 1A:
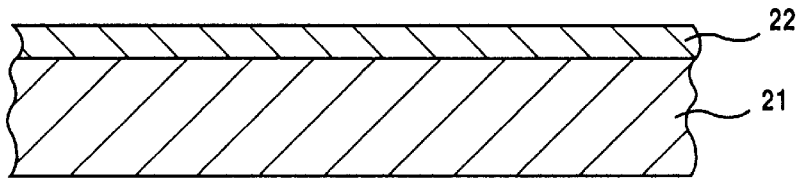
FIGS. 1(a) to 1(f) are explanatory diagrams illustrating steps of producing a semiconductor light emitting device according to the present invention.

The procedure of the method starts with removing an oxide film from a single-crystal silicon substrate 21 having a (111) crystal plane as its principal plane. Then, 500° C. to 900° C. of heat is applied under an atmosphere of nitrogen gas to nitrogenize a surface region of the substrate 21, forming an insulating layer 22 which comprises $Si_3N_4$, for example, and has a thickness of approximately 1 to 5 nanometers, as shown in FIG. 1(a).

Figure 1B:
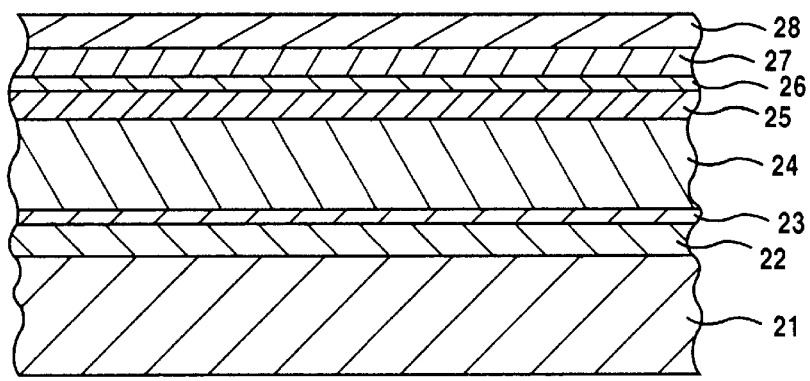
Figure 1C:
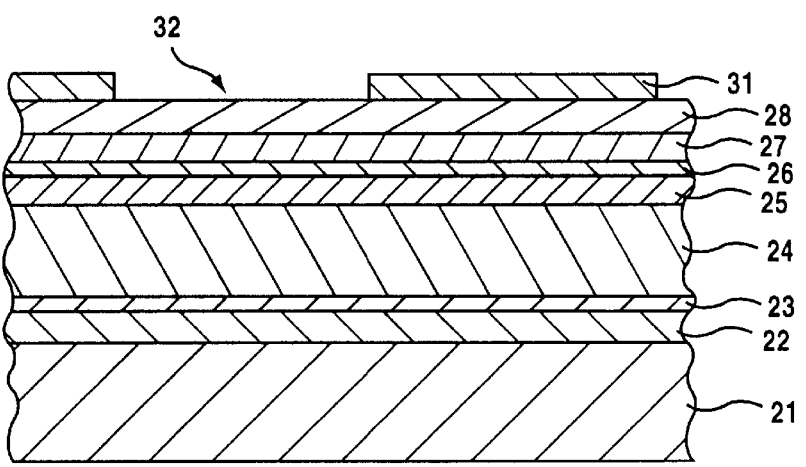

This is followed by introducing metal organic gas and impurity dopant gas for deposition of layers using MOCVD method as is the case with prior arts explained hereinbefore, as shown in FIG. 1(b). More particularly, in sequence on the insulating layer 22, a low-temperature buffer layer 23 comprising n-type GaN having a thickness of approximately 0.01 to 0.2 micrometer, a high-temperature buffer layer 24 comprising n-type GaN having a thickness of approximately 2 to 5 micrometers at temperature ranging 700° C. to 1200° C., a lower cladding layer 25 comprising n-type $Al_xGa_{1-x}N$ (0<x<1) having a thickness of approximately 0.1 to 0.3 micrometer, an active layer 26 comprising non-doped $Ga_nIn_{1-n}N$ (0<n≦1) having a thickness of approximately 0.05 to 0.1 micrometer, which is smaller in band gap energy than the cladding layers, an upper cladding layer 27 comprising p-type $Al_xGa_{1-x}N$ having a thickness of approximately 0.1 to 0.3 micrometer, and a cap layer 28 comprising p-type GaN having a thickness of approximately 0.3 to 2 micrometers are provided Then the surface of stacked semiconductor layers is coated at the top with a resist layer 31 of approximately 0.3 to 3 micrometers in thickness having a pattern uncovering regions to be etched, as shown in FIG. 1(c). The pattern of the resist layer is arranged so that the side of its opening 32 is substantially perpendicularly to the top surface of the substrate 21 or the stacked semiconductor layers.

Figure 1D:
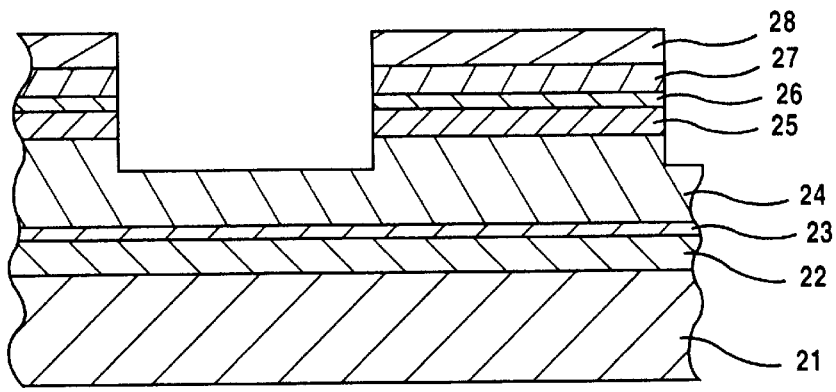
Figure 1E:
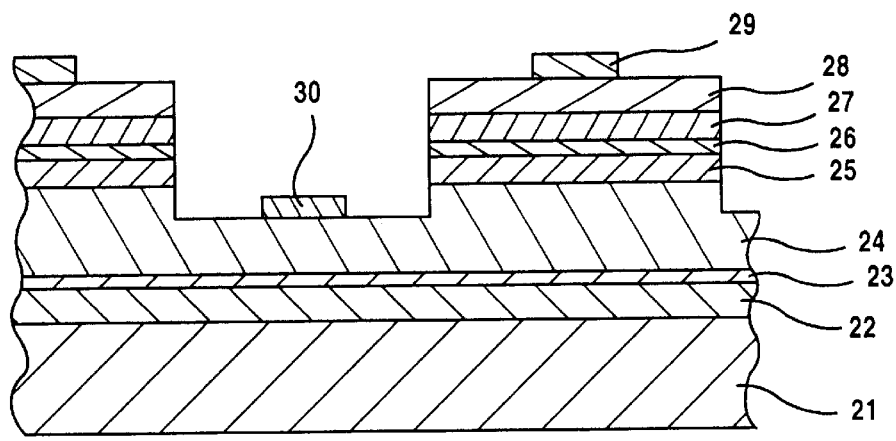
Figure 1F:
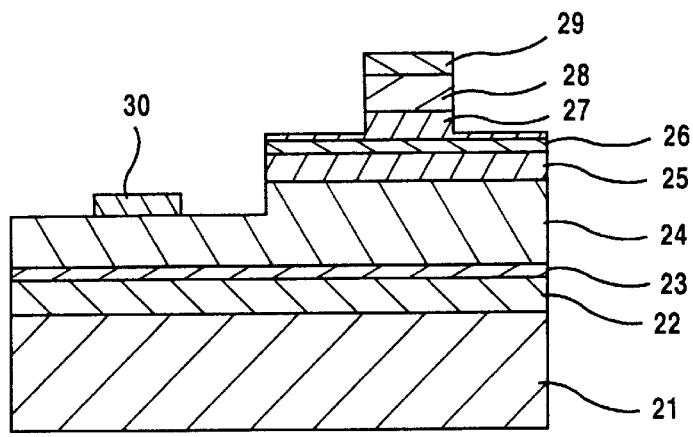
Figure 2:
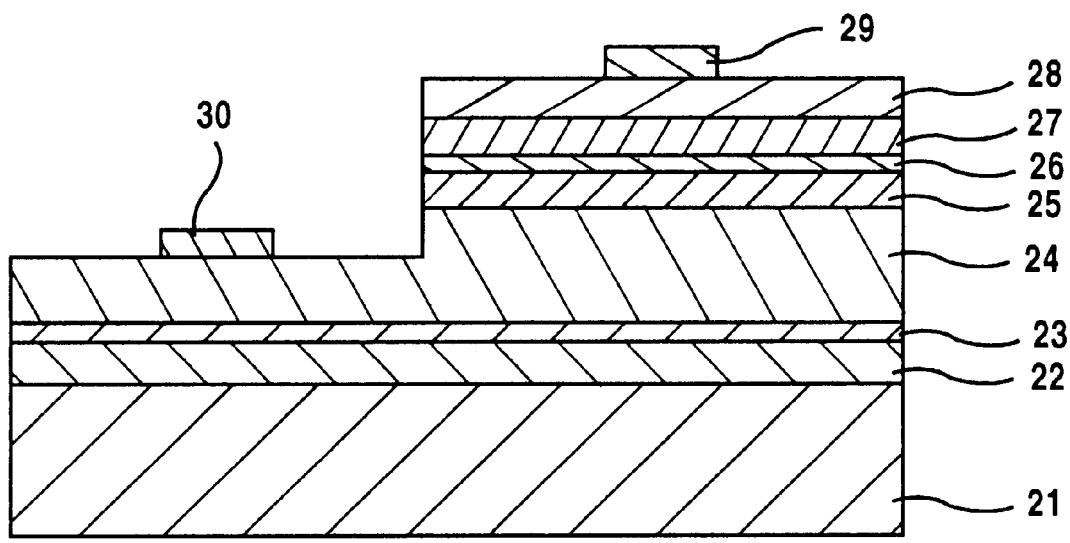
FIG. 2 is an explanatory cross sectional view of an LED according to the present invention.

Next, the stacked semiconductor layers is subjected to reactive ion etching process under an atmosphere of $Cl_2$ plasma gas where the active layer 26 is etched until the n-type cladding layer 25 or the high-temperature buffer layer 24 is exposed as shown in FIG. 1(d). As thus etched surface determines the end surfaces of the semiconductor light emitting device. The etching process is designed so that the light emitting surfaces exposing the active layer and end surfaces facing to the light emitting surface through a light waveguide are (0001) crystal plane of the $Ga_nIn_{1-n}N$ layer. Accordingly, the end surfaces are finished to be smooth and favorable quality mirror surfaces. Then, a pattern of metal coating made of Au or Al is provided to form a p-side electrode 29 on the cap layer 28 and an n-side electrode 30 on the exposed high-temperature buffer layer 24 (FIG. 1(e)). This is followed by dicing to produce an LED chip form shown in FIG. 2. Alternatively, the cap layer 28 and a part of the upper cladding layer 27 are etched with p-side electrode being used as a mask by a reactive ion etching process under an atmosphere of $Cl_2$ gas to form a mesa type, then the substrate 21 is cleft in such a direction that smooth crystal planes of the substrate and epitaxial growth layers are exposed. As a result, the semiconductor laser chip of Example 1 has a light emitting surface highly smoothed while its p-side electrode 29 extending in a stripe of 4 to 10 micrometers wide and provided with mirror end surfaces (FIG. 1(f)).

The insulating layer of Example 1 for covering the gallium nitride type compound semiconductor layer is made of silicon nitride (for example $Si_2N_4$) which can easily be processed only by means of simple heat treatment under an atmosphere of nitrogen gas. Also, nitrogen atoms exist commonly in both the insulating layer and the gallium nitride type compound semiconductor layer, thus allowing any interface between the layers to be matched as free from undesirable distortion, accordingly the gallium nitride type compound semiconductor layer with high quality surface can be obtained.

Example 2

This Example 2 shows an example according to the first aspect of the present invention wherein alminum oxide is employed as an insulating layer 22 instead of sillicon nitride and others are the same as in Example 1. As is the case with Example 1, preparing a single-crystal silicon substrate having (111) crystal plane as a principal plane, an insulating layer 22 comprising aluminum oxide, $Al_2O_3$, instead of silicon nitride is formed by means of sputtering, evaporation or the like. the insulating layer is formed by a thickness of approximately 0.01 to 0.1 micrometer over a prepared single-crystal silicon substrate 21. Similarly, as is the case with Example 1, a couple of buffer layers, a couple of cladding layers, and an active layer of gallium nitride type compound semiconductor materials by means of MOCVD method are stacked and then semiconductor light emitting device shown in FIGS. 1(a) to 1(f) or FIG. 2 is obtained.

In this Example 2, the gallium nitride type compound semiconductor layers, an aluminum oxide intervening between the gallium nitride type compound semiconductor layers and the single-crystal sillicon substrate, allows their properties to remain stable. Accordingly, the characteristic properties of the layers are determined by a wider margin allowing more freedom of designing the light emitting device.

In each of the prescribed Examples 1 and 2, both the light emitting surfaces of the both sides of the active layer 26 are substantially perpendicular to the top surface of the substrate 21. Also, the active layer 26 is sandwiched by the two, upper cladding layer and lower cladding layer which are high in band gap energy. As a result, the semiconductor laser acts as a resonator provided with two opposite mirror end surfaces thus increasing the efficiency of light emission. A laser beam output from the active layer 26 proceeds parallel to the surface of the substrate and a direction of the laser beam can easily be aligned with the optical axis of a converging lens.

In the prescribed Examples 1 and 2, the light emitting end surfaces may be produced by cleavage instead of etching. In case of the cleavage, the stacked semiconductor layers structure is cleft in a direction perpendicular to the etching direction which is determined for forming the n-side electrode 30. Accordingly, while its cleft surfaces include the light emitting surfaces, a resultant device acts as an optical resonator provided with mirror surfaces which are highly finished.

Example 3

This Example 3 shows an example according to the second aspect of the present invention wherein gallium nitride type compound semiconductor layers including a light emitting layer are stacked to product on a gallium nitride type semiconductor substrate as a semiconductor substrate. In this case, since the gallium nitride type compound semiconductor cannot directly be produced, the gallium nitride type compound semiconductor is obtained by providing the gallium nitride compound semiconductor layers on the other semiconductor substrate, utilizing the semiconductor layers as a new substrate, so that a semiconductor for blue light emitting element comprising gallium nitride type compound semiconductor is realized.

Figure 3A:
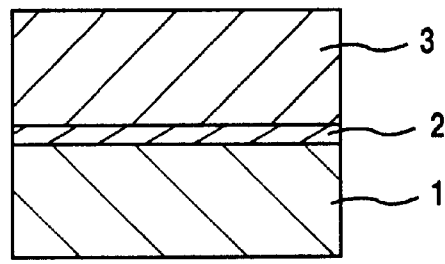
FIGS. 3(a) to 3(e) are explanatory diagrams illustrating steps for producing a semiconductor light emitting device according to the present invention.

As shown in FIG. 3(a), a low-temperature buffer layer 2 and a high-temperature buffer layer 3 both comprising a gallium nitride type compound semiconductor material are first deposited on a single-crystal semiconductor substrate 1 by use of MOCVD method.

The single-crystal semiconductor substrate 1 can be selected from the group consisting of GaAs single-crystal semiconductor, GaP single-crystal semiconductor, InP single-crystal semiconductor, and Si single-crystal semiconductor, each having a (111) crystal plane as a crystal plane. The single-crystal semiconductor substrate 1 having (111) crystal plane is substantially used because crystalline quality of the gallium nitride type compound semiconductor layer is most suitable. Also, above-mentioned single-crystal semiconductor substrate, for example GaAs and the like, is selected as its lattice constant is more approximate to that of gallium nitride type compound semiconductors than any other materials, thus minimizing distortion on the gallium nitride type compound semiconductor layers.

For deposition of an $Al_pGa_qIn_{1-p-q}N$ ($0 \leq p<1$, $0<q \leq 1$, $0<p+q \leq 1$) semiconductor layer, the MOCVD method may be implemented by placing the substrate in a reaction furnace and feeding carrier gases in each gas flow rate with a desired ratio of a carrier of $H_2$ gas, a raw gas of Al in the form of TMA as metal organic gas, a raw gas of Ga in the form of TMG as metal organic gas, a raw gas of In in the form of TMI as metal organic gas, and N in the form of $NH_3$ gas for chemical reaction over the substrate. If the semiconductor layers of different compositions are wanted to be grown, different compositions can be deposited by varying the ratio of the materials or adding relevant elements of gaseous form. The $Al_xGa_{1-x}N$ layer and the $Ga_nIn_{1-n}N$ layer in Example 1 are particular examples in case of the $Al_pGa_qIn_{1-p-q}N$ layer at p=x, q=1−x and p=o, q=n.

The single-crystal structure of the gallium nitride type compound semiconductor is developed by heating at 700° C. to 1200° C. It is noted that the crystal direction may not completely be uniform if the layer is deposited directly on the substrate which is different material in lattice constant and the like from that of the layer. It is thus desired to form the low-temperature buffer layer 2 of polycrystalline form by approximately 0.01 to 0.2 micrometer thick, at low temperature ranging from 400° C. to 700° C., and to deposit the high-temperature buffer layer 3 of approximately 50 to 200 micrometers in thickness on the layer 2 at high temperature ranging from 700° C. to 1200° C. The low-temperature buffer layer 2 is shifted from polycrystalline form to single-crystal form during the deposition of the high-temperature buffer layer 3 so that the two layers 2 and 3 are matched to each other in lattice constant.

Figure 3B:
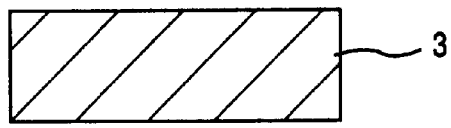

The single-crystal semiconductor substrate 1 and the low-temperature buffer layer 2 are then removed by abrading mechanically or chemically at their rear surface side, as shown in FIG. 3(b). The mechanical abrading may be carried out with a diamond powder grinder and the chemical abrading may be implemented by use of a liquid mixture of sulfuric acid and hydrogen peroxide.

Figure 3C:
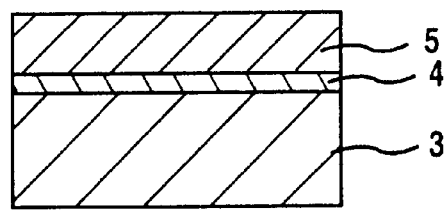

As shown in FIG. 3(c), the high-temperature buffer layer 3 of gallium nitride type compound semiconductor is placed in the reaction furnace as a new substrate and a low-temperature buffer layer 4 with a thickness of approximately 0.01 to 0.2 micrometer and a high-temperature buffer layer 5 with a thickness approximately 1 to 40 micrometers both which comprise the single-crystal gallium nitride type compound semiconductor are deposited on the buffer layer 3 in the prescribed manner. A cladding layer and an active layer of gallium nitride type compound semiconductor may be deposited directly on the single-crystal semiconductor buffer layer 3 without forming the two buffer layers 4 and 5, since in chemical composition the buffer layer 3 is similar to the cladding layer and active layer. The gallium nitride type compound semiconductor layer 3 which is utilized as the new substrate is initially formed on the single-crystal substrate 1 which is different in composition and may have lattice defect or dislocation caused by the lattice mismatch. Possibly, such lattice defect and dislocation are easily propagated to the single-crystal gallium nitride type compound semiconductor layers formed on the new substrate. For preventing the propagation, it is preferable that the two buffer layers 4 and 5 are prepared. The method of deposition and properties of the two buffer layers 4 and 5 are identical to those of the low-temperature buffer layer 2 and the high-temperature (gallium nitride type compound semiconductor substrate) buffer layer 3 shown in FIG. 3(a).

Figure 3D:
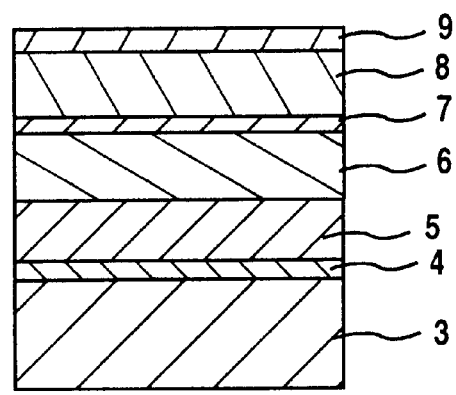

This process is followed by depositing in sequence an n-type cladding layer 6, a non-doped or an n-type or a p-type active layer 7, a p-type cladding layer 8, and a cap layer 9 as shown in FIG. 3(d). Each of the cladding layers 6 and 8 has commonly thickness of approximately 0.1 to 2 micrometers while the active layer 7 is as thin as approximately 0.02 to 0.2 micrometer. The thickness of the active layer 7 may be minimized so as to be free from the generation of lattice defect or dislocation. On the contrary, the thickness of the cladding layers 6 and 8 is limited for thinning. Accordingly, the cladding layers 6 and 8 are not small in thickness and susceptible to distortion if different materials are employed for the cladding layer and the buffer layer which are thicker than the other layers. It is thus preferred that the material composition of the cladding layers 6 and 8 are identical to that of the high-temperature buffer layer 5.

For producing the semiconductor layer such as the prescribed cladding layer and the like, to be n-type semiconductor layer, an impurity dopant of Si, Ge, or Sn is mixed with the gaseous materials in the form of $SiH_4$, $GeH_4$, or $SnH_4$ respectively. Similarly, when Mg or Zn is added in the form of $CP_2Mg$ or DMZn metal organic gas to the gaseous materials, the p-type semiconductor layer is deposited. The p-type layer is lowered in resistance by annealing at 400° C. to 800° C. and providing a protective coating comprising $SiO_2$ and the like over the cap layer 9 or by exposing to a beam of electrons for separation of H from Mg and for mobility of Mg (which has been bonded to H of the $H_2$ as a carrier gas or $NH_3$ as a reaction gas.)

In this example, a double heterojunction is constructed by sandwiching the active layer 7 between the two, p-type and n-type, cladding layers 6, 8. The cladding layers 6 and 8 are arranged to be greater in band gap energy than the active layer 7. It is known for having a higher rate of band gap energy to increase p of $Al_pGa_qIn_{1-p-q}N$ while decreasing 1−p−q. Since the two cladding layers 6 and 8 having such a high rate of the band gap energy are joined in the sandwich structure, carriers fed into the active layer (which acts as a light emitting layer) can be trapped between the two energy barrier produced between the active layer and the cladding layer. Accordingly, the action of emission and recombination will be enhanced distinctly in the structure of the present invention as compared with a conventional homojunction structure where pn junction is developed between two equal materials, thus allowing the efficiency of emission of light to be increased. The method of producing light emitting device according to the present invention is not limited to the double heterojunction structure but also applicable with equal success to a semiconductor multilayered device which has a homojunction or heterojunction structure for pn junction with only their layer compositions being varied. By providing a stripe groove by semiconductor laser, similarly the semiconductor light emitting device having a refractive index type waveguide construction can be produced. It is noted that the cap layer 9 is provided for minimizing the contact resistance on an electrode metal 10 and has a thickness of at most approximately 0.2 to 2 micrometers.

Next, as described above, the surface of the semiconductor layers is coated with a protective layer made of $SiO_2$, $Si_3N_4$, $Al_2O_3$, GaAs or InP and annealed for approximately 20 to 60 minutes at a temperature ranging from 400° C. to 800° C. Alternatively, it is exposed to a beam of electrons with approximately 3 to 20 kV of an accelerating voltage while no protective layer is applied. As a result, the bonding between Mg and H which are doped in the p-type layer is canceled and activated thus decreasing the electrical resistance of the p-type layer. As described above a semiconductor wafer having a multilayer structure for a semiconductor light emitting device is produced.

A lower electrode 11 (at n side) is provided on the rear side of the semiconductor wafer by means of vapor deposition or sputtering of Au or Al material. On the front side of the semiconductor wafer, an upper electrode 10 (at p side) is arranged by patterning at a central region in order to give a space for the emission of light when the element is employed for an LED, or in order to restrict a current receiving area when the element is employed for a semiconductor laser diode. The semiconductor wafer is finally cleft to a plurality of semiconductor light emitting chips, one being shown in a perspective view of FIG. 3(e).

To form an LED, the semiconductor light emitting chip is placed in a lead frame, connected by wire bonding, and molded with epoxy resin material. The semiconductor light emitting chip turns to a laser diode when it is placed on a stem framework, connected by wire bonding, and sealed with a cap.

The light emitting device and the method for producing the same according to the second aspect of the present invention will now be explained in more details referring to Examples 4 to 6.

Example 4

Figure 4:
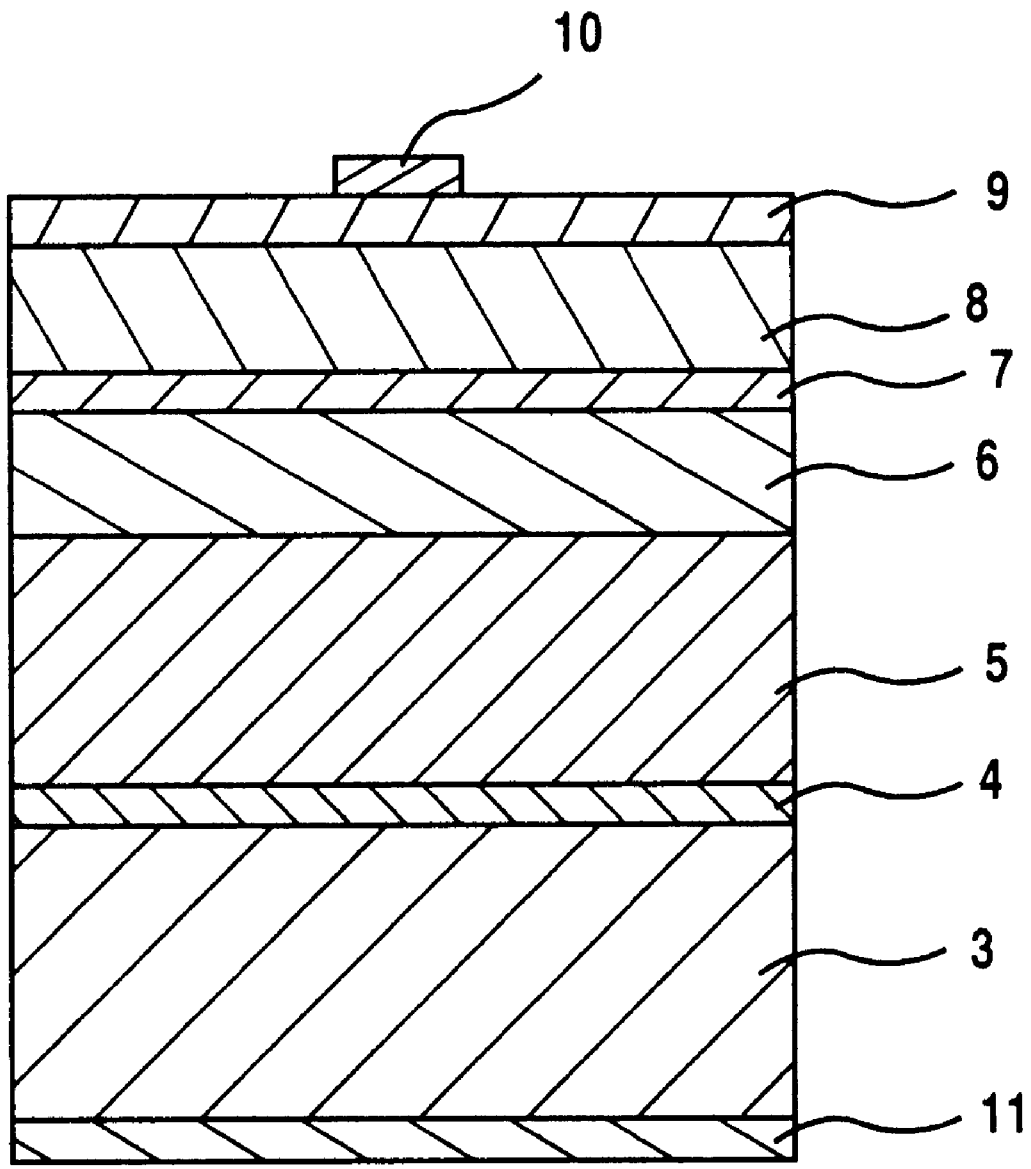
FIG. 4 is an explanatory cross sectional view of an LED produced by the method according to the present invention.

FIG. 4 is an explanatory cross sectional view of a gallium nitride type double heterojunction LED produced by the method of the Example 3. The double heterojunction is produced by varying a ratio of Al, Ga, and In of a gallium nitride type compound semiconductor material expressed by $Al_pGa_qIn_{1-p-q}N$.

A low-temperature buffer layer 4 comprising n-type $Al_vGa_wIn_{1-v-w}N$ (where $0 \leq v < 1$, $0 < w \leq 1$, $0 < v+w \leq 1$, $v \leq x$, and $1-x-y \leq 1-v-w$), of approximately 0.01 to 0.2 micrometer thick, is deposited at a low temperature of 400° C. to 700° C. by MOCVD method on a gallium nitride type compound semiconductor substrate 3 which has a thickness of 50 to 200 micrometers and comprises an n-type $Al_vGa_wIn_{1-v-w}N$ semiconductor layer, with utilizing the gallium nitride type compound semiconductor layer as a new substrate as shown in FIG. 3(b). Then, a high-temperature buffer layer 5 comprising n-type $Al_vGa_wIn_{1-v-w}N$ (for example, v=0, w=1)

which is identical to the composition of the gallium nitride type compound semiconductor substrate 3 and having a thickness of approximately 1 to 40 micrometers is provided on the buffer layer 4 at a high temperature of 700° C. to 1200° C. by the same MOCVD method. This is followed by growing an n-type cladding layer 6 comprising n-type $Al_xGa_yIn_{1-x-y}N$ (where $0\leq x<1$, $0<y\leq 1$, $0<x+y\leq 1$, for example $y=1-x$) to a thickness of approximately 0.1 to 2 micrometers at 700° C. to 1200° C., an active layer 7 comprising non-doped $Al_mGa_nIn_{1-m-n}N$ (where $0\leq m<1$, $0<n\leq 1$, $0<m+n\leq 1$, m<x, and $1-m-n>1-x-y$, for example m=o) to a thickness of approximately 0.02 to 0.2 micrometer, and a p-type cladding layer 8 comprising p-type $Al_xGa_yIn_{1-x-y}N$ to a thickness of approximately 0.1 to 2 micrometers. Furthermore, a cap layer 9 comprising $Al_rGa_sIn_{1-r-s}N$ (where $0\leq r<1$, $0<s\leq 1$, $0<r+s\leq 1$, $r\leq x$ and $1-x-y\leq 1-r-s$, for example, r=0, s=1) and having a thickness of about approximately 0.2 to 2 micrometer is deposited on the p-type cladding layer 8 to reduce contact resistance at the electrode.

In the stacked layers the two cladding layers 6 and 8 are identical in composition to each other and greater in band gap energy than the active layer 7. That is, by increasing the amount of Al and decreasing the amount of In, the band gap energy of the material is increased. As the active layer 7 having a smaller band gap energy is sandwiched between the higher band gap energy cladding layers 6 and 8, carriers fed into the active layer 7 are trapped between the energy barriers, thus increasing the efficiency of light emission.

The semiconductor layers are then exposed to a beam of electrons for minimizing the resistance in the p-type layer 8, equipped with electrodes, whereby obtaining a semiconductor wafer having multi-layer structure and the semiconductor wafer is cleft to specific chips. As a result, an LED for blue light of which the output is approximately 0.5 candela (cd) in luminance having a double heterojunction is obtained.

The LED of Example 4 has the low band gap energy active layer sandwiched to have a double heterojunction and will thus be increased in the efficiency of light emission. Simultaneously, as thicker layers, the cladding layers and the buffer layers comprising the semiconductor materials which are indentical in chemical composition, while the other semiconductor layers made of different compositions are reduced to such smaller values of the thickness as not to create any lattice defect. Accordingly, the semiconductor wafer having multilayer structure is improved in the physical quality and will thus be cleft with much ease.

Example 5

Figure 5:
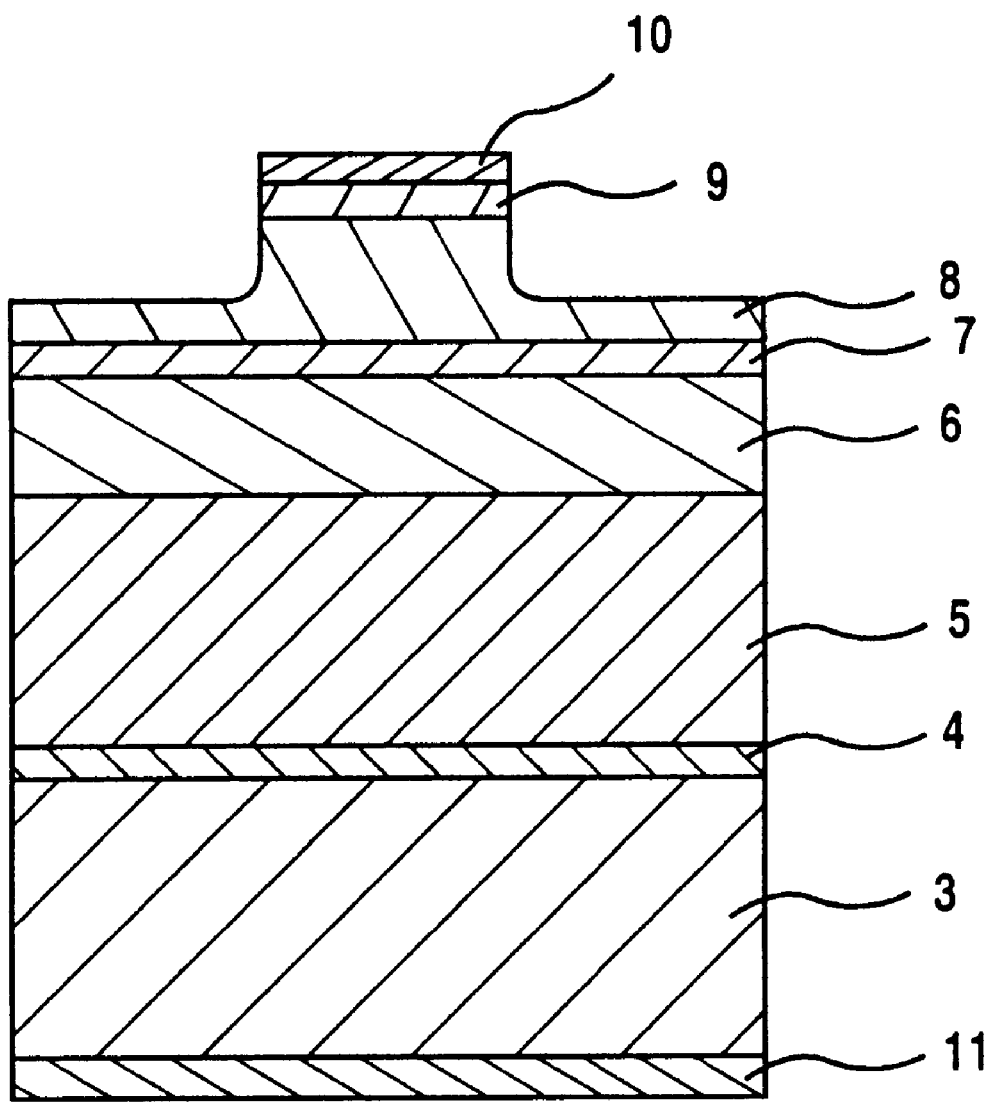
FIG. 5 is an explanatory cross sectional view of a semiconductor laser device according to the present invention.

A semiconductor laser device, whose explanatory cross sectional view is shown in FIG. 5, of this example is identical to the LED of Example 4 by the fact that the layers and electrodes are produced by the same manner. Hence, like components shown in FIG. 5 are denoted by the same numerals as those of Example 4. Stacking each semiconductor layer, as is the case with Example 4, the laser device of Example 5 has a mesa type produced on the top thereof by etching a cap layer 9 at both sides of an upper electrode 10, and upper side of a p-type cladding layer 8. This arrangement allows a current to flow across a central region of the active layer. Also, both end surfaces of the laser are mirror surfaces by cleaving so that oscillation occurs between the mirror end surfaces. As a result, the semiconductor laser device for blue light of which the output is approximately 0.2 mW is obtained.

Example 6

Figure 6:
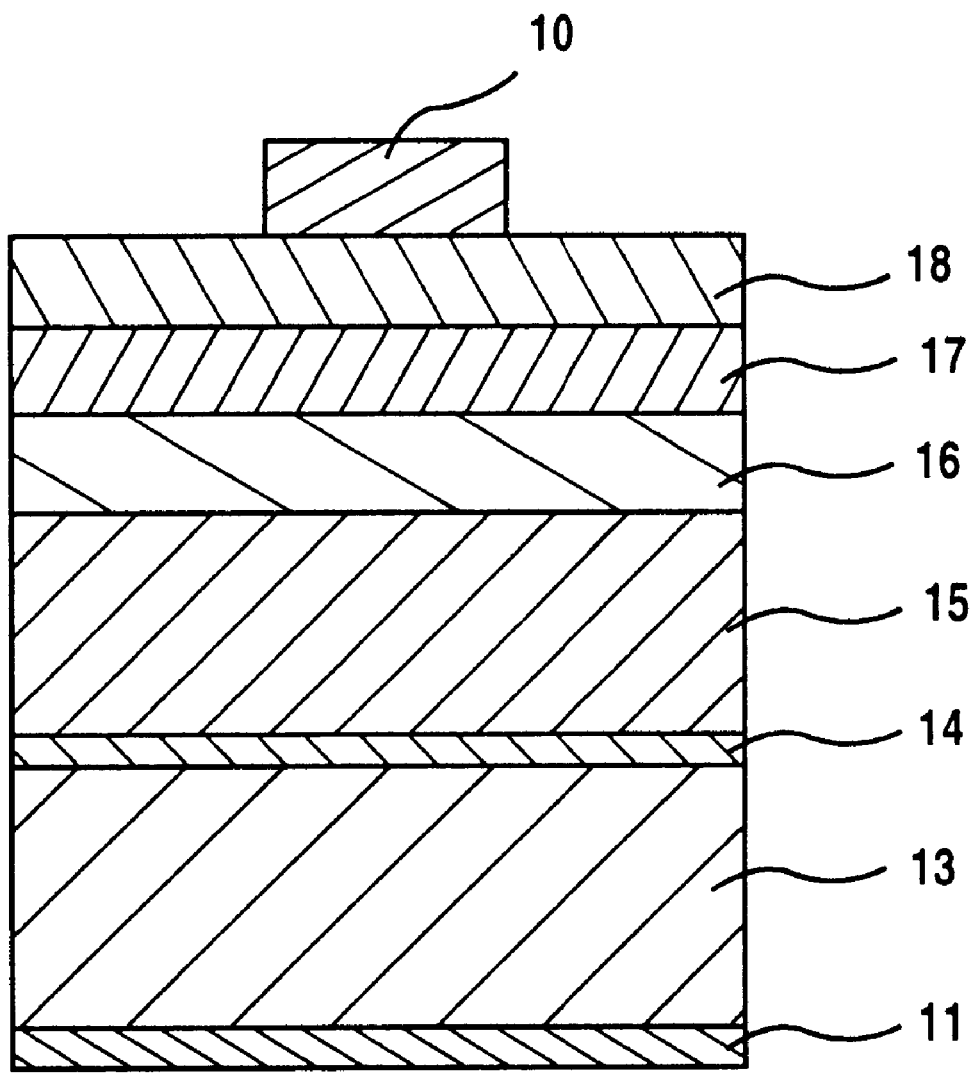
FIG. 6 is an explanatory cross sectional view of an LED according to the present invention.
Figure 7:
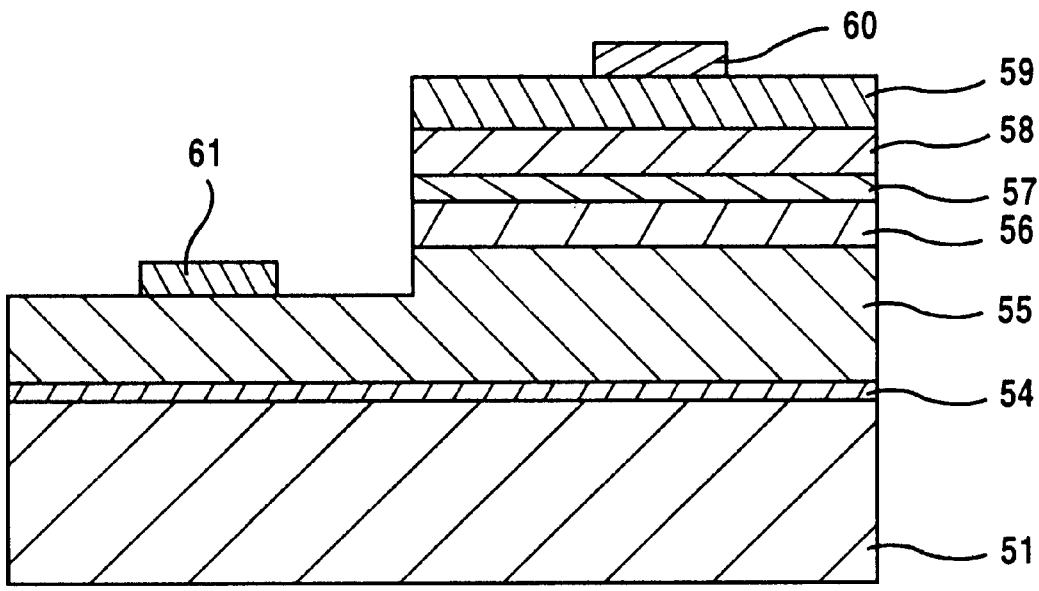
FIG. 7 is an explanatory cross sectional view of a conventional gallium nitride LED.
Figure 8:
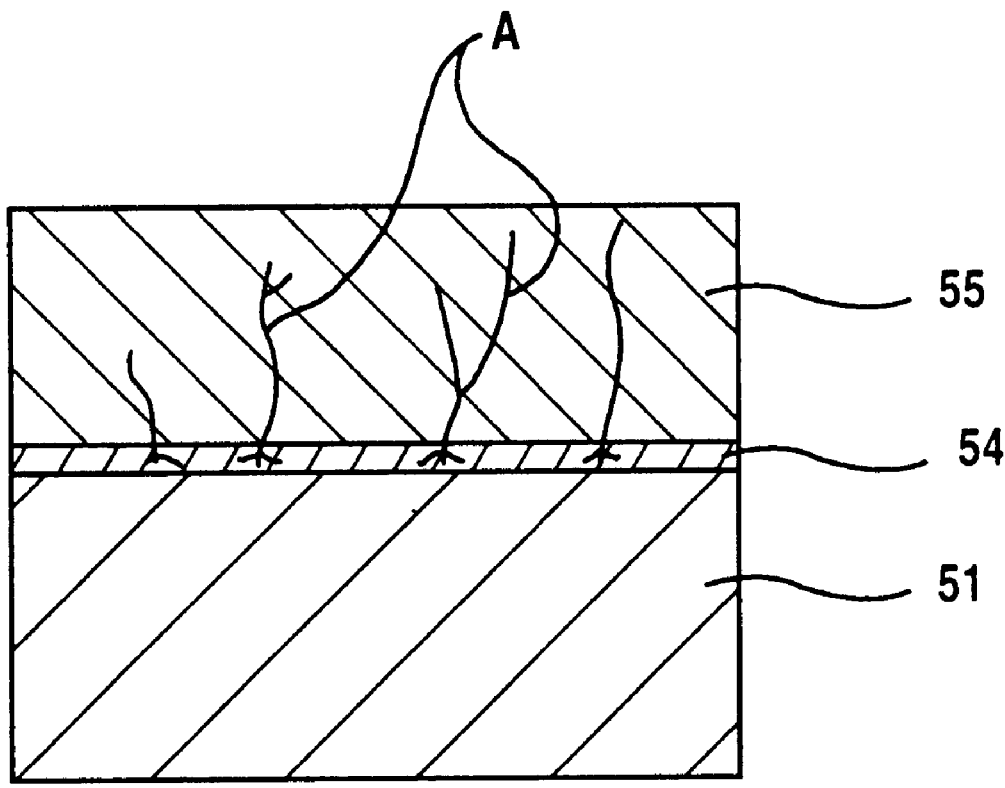
FIG. 8 illustrates dislocation in a buffer layer formed on a conventional sapphire substrate.

An LED of this Example 6, of which explanatory cross sectional view is shown in FIG. 6, having a pn junction is produced by growing a low-temperature buffer layer 14 comprising n-type GaN semiconductor by a thickness of approximately 0.01 to 0.2 micrometer on a gallium nitride type compound semiconductor substrate 13 and a high-temperature buffer layer 15 comprising n-type GaN semiconductor by a thickness of approximately 1 to 40 micrometers under the same conditions as in Example 4. This is followed by forming an n-type layer 16 comprising n-type $Al_tGa_{1-t}N$ ($0\leq t<1$), approximately 0.1 to 2 micrometers thick, a p-type layer 17 comprising p-type $In_uGa_{1-u}N$ ($0\leq u<1$), approximately 0.01 to 2 micrometers thick, and a cap layer 18 comprising p-type $Al_zGa_{1-z}N$ ($0\leq z<1$). The p-type layers are then exposed to a beam of electrons produced with an accelerating voltage of approximately 3 kV to 20 kV and are annealed. Then a lower electrode 11 (at n side) and an upper electrode 10 (at p side) are provided, the LED having a pn heterojunction is obtained While its heterojunction enhances the efficiency of light emission, an LED for blue light of which the luminance is approximately 0.2 candela is obtained.

Example 7

This Example 7 is an example according to the third aspect of the present invention using group II-VI compound material, for example, ZnSe, ZnS as a semiconductor substrate.

First, group II-VI compound semiconductor substrate as the substrate 3, such as a ZnSe substrate and a ZnS substrate, approximately 50 to 500 micrometers thick, instead of a gallium nitride type semiconductor substrate is prepared, as shown in FIG. 3(b).

Either ZnSe or ZnS of the substrate is preferably provided with a (111) crystal plane as a principal plane. Also, the group VI atoms of the group II-VI compound semiconductor substrate, namely Se or S, are exposed on the top surface. The method for producing the substrate is as follows. First, determining the direction of (111) crystal plane is determined by use of an X-ray diffraction analysis method. The surfaces where the VI group atoms are exposed (hereinafter referred to as "A" plane) are orientated in one direction upon dicing so that the (111) crystal plane is a principal plane. This allows the (111) crystal plane or A plane to be identified when a larger atom-radius is measured with a tunnel current microscope since a direction where atom-radius is larger is (111) A plane.

Figure 3E:
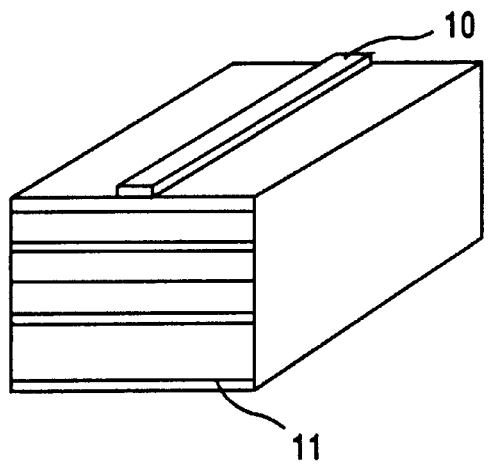

Then, in the same manner as those of Examples 3, 4, shown in FIG. 3(c) to FIG. 3(e), a low-temperature buffer layer, $Al_vGa_wIn_{1-v-w}N$ (where $0\leq v<1$, $0<w\leq 1$, $0<v+w\leq 1$, for example v=0, w=1) and other semiconductor layers are stacked and the electrodes 10, 11 are formed. As a result, the semiconductor light emitting device of Example 7 which has the same sectional structure as shown in FIG. 4 is obtained.

In Example 7, if the cladding layer and the active layer are directly grown to gallium nitride type compound single crystal structures on the semiconductor substrate, lattice defect and dislocation caused by lattice mismatch may occur. This problem is avoided by providing the low-temperature buffer layer 4 and high-temperature buffer layers 5 to obtain the cladding layer and the active layer, these layers having fine crystalline structure. The high-temperature buffer layer 5 may be utilized also as a part of the cladding layer.

Further in Example 7, since semiconductor substrate is not made by means of epitaxial growth, desired thickness can be obtained. Thus the high-temperature buffer layer need not to be so thick, and can be provided sufficiently by approximately 2 to 5 micrometers thick.

The semiconductor layers are then exposed to a beam of electrons for minimizing the resistance in the p type layer 8, equipped with electrodes 10, 11 whereby obtaining a semiconductor wafer having multilayer structure, and the semiconductor wafer is cleft to a specific form. As a result, an LED for blue light of which the luminance is approximately 0.5 candela (cd) having a double heterojunction is obtained.

The LED of Example 7 has the low band gap energy active layer sandwiched to have a double heterojunction and will thus be increased in efficiency of light emission. Simultaneously, the cladding layers and the buffer layers comprising the thick semiconductor materials which are identical in chemical composition while the other semiconductor layers made of different compositions are reduced to such smaller values of the thickness as not to generate any lattice defect. Accordingly, the semiconductor wafer having multilayer structure is improved in the physical quality and will thus be cleft with much ease

Example 8

This Example 8 shows an example wherein a semiconductor substrate which is the same substrate as Example 7, is employed as a substrate, and a semiconductor light emitting device is employed as a semiconductor laser.

In this example, since the same type semiconductor substrate as that of Example 7 is prepared, stacking the semiconductor layers same as Example 5 are stacked and the electrodes are formed, the semiconductor laser having the same structure is obtained as shown in FIG. 5.

This arrangement allows a current to flow across a central region of the active layer. Also, both end surfaces of the laser are mirror surface finished by precision cleaving so that oscillation occurs between the mirror end surfaces. As a result, the semiconductor laser device for blue light of which the output is approximately 0.2 mW is obtained.

Example 9

This Example 9 shows an example wherein a II-VI compound semiconductor substrate is employed as a semiconductor substrate, which is the same as Example 7, and an LED having a pn junction is employed as a semiconductor light emitting device.

In this Example 9, since the same type semiconductor substrate as in Example 7 is prepared, the semiconductor layers same as Example 6 are stacked and the electrodes is formed, then the pn junction LED having a heterojunction having the same structure as shown in FIG. 6 is obtained.

While its heterojunction enhances the efficiency of light emission than homojunction, the LED for blue light of which the luminance is at least 100 millicandelas (mcd) is obtained.

Example 10

This Example 10 shows an example according to the fourth aspect of the present invention, wherein a group III-V compound semiconductor substrate such as GaAs, InAs, GaP and InP as a semiconductor substrate is employed.

First, a semiconductor substrate comprising the group III-V compound material such as GaAs, InAs, GaP or InP, approximately 50 to 500 micrometers thick is employed instead of the gallium nitride type semiconductor substrate as shown in FIG. 3(b). The substrate is provided with a (111) crystal plane as a principal plane. Also, group V atoms, namely As or P, are exposed on the top surface (hereinafter referred to as "(111) A plane"). The method for producing the substrate starts with determining the direction of (111) crystal plane by use of an X-ray diffraction analysis method. After dicing in parallel with the (111) crystal plane, a surface containing atoms of a larger radius is the (111) A plane. Hence, when the larger radius is measured by a tunnel current microscope, its surface can be identified as the (111) A plane.

Then, in the same manner as those of Examples 3, 4, shown in FIG. 3(c) to FIG. 3(e), a low-temperature buffer layer, $Al_vGa_wIn_{1-v-w}N$ (where $0 \leq v<1$, $0<w \leq 1$, $0<v+w \leq 1$, for example v=0, w=1) and other semiconductor layers are stacked and the electrodes 10, 11 are formed. As a result, the semiconductor light emitting device of Example 10 which has the same sectional structure as shown in FIG. 4 is obtained.

If the cladding layer and the active layer are directly grown to gallium nitride type compound single-crystal structures, lattice defect and dislocation caused by lattice mismatch may occur. This problem is avoided by providing the low-temperature buffer layer 4 and high-temperature buffer layers 5. The high temperature buffer layer 5 may be utilized as a part of the cladding layer.

In this Example 10, like other examples, since the semiconductor substrate is not the semiconductor layer substrate which is made by means of epitaxial growth, the substrate is thick enough. Thus the high-temperature buffer layer needs not to be so thick, and can be provided sufficiently by approximately 2 to 5 micrometers thick.

After forming the semiconductor layers, the semiconductor layers is then exposed to a beam of electrons for minimizing the resistance in the p-type layer, equipped with electrodes, whereby obtaining a semiconductor wafer having multi-layer structure and the semiconductor wafer is cleft to a specific form. As a result, an LED for blue light of which the luminance is approximately 0.5 candela (cd) having a double heterojunction is obtained.

The LED of Example 10 has the low band gap energy active layer which is sandwiched to compose a double heterojunction and will thus be increased in efficiency of light emission. Simultaneously, the cladding layer and buffer layer comprising the semiconductor materials which are equal to each other in chemical composition, while the other semiconductor layers made of different composition are reduced to such smaller values of the thickness as not to generate any lattice defect. Accordingly, the semiconductor wafer having multilayer structure is improved in physical quality and will thus be cleft with much ease.

Example 11

This Example 11 shows an example wherein a group III-V compound semiconductor substrate which is the same substrate as in Example 10 is employed and a semiconductor laser is employed as a light emitting device. In this Example 11, since preparing the same semiconductor substrate as Example 10, stacking the semiconductor layers same as Example 5 and forming the electrodes, a semiconductor laser can be obtained that has the same structure shown in FIG. 5.

This arrangement allows a current to flow across a central region of the active layer. Also, both end surfaces of the laser are mirror surfaces by cleaving so that oscillation occurs between the mirror ends surfaces. As a result, the semiconductor laser device of blue light of which the output is approximately 0.2 mW is obtained.

Example 12

This Example 12 shows an example wherein a semiconductor substrate of group III-V compound material which is the same substrate as in Example 10 is employed and a pn junction LED is employed as a light emitting device. In this Example 12, since preparing the same semiconductor substrate as Example 10, stacking the semiconductor layers same as Example 6 and forming the electrodes, a pn junction LED having a heterojunction can be obtained that has the same structure as in FIG. 6.

While its pn heterojunction ensures a higher efficiency in the light emission than pn homojunction, the LED blue light of which the luminance is approximately 0.2 candela (cd) is obtained.

Although the foregoing examples according to the present invention are described in the form of semiconductor laser devices having a stripe pattern of the current feeding region produced by mesa etching technique, they are illustrative but not limitative. Other variations of the blue light semiconductor laser device of gallium nitride type compound semiconductor having a current blocking layer of opposite conductive type, the blocking layer being inserted in the cladding layer in which a stripe groove is formed, or having an embedded structure will be made with equal success wherein the sides are perpendicular to the substrate. The gallium nitride type compound semiconductor layers are not limited to the compositions shown above. It may be determined with p and q of $Al_pGa_qIn_{1-p-q}N$ (where $0 \leq p < 1$, $0 < q \leq 1$ and $0 < p+q \leq 1$) so that the band gap energy of the active layer is smaller than that of the cladding layers. Also, a material wherein a part or all of N in $Al_pGa_qIn_{1-p-1}N$ is substituted with As and/or P is applicable to the present invention. Not only the laser diode but also the LED according to the present invention can be adapted in which a laser output is emitted from not a top but a perpendicular side. Thus, the laser output of the LED is allowed to emit in a specified direction regardless of either the double heterojunction or the pn junction structure.

According to the first aspect of the present invention, the single-crystal substrate is employed and gallium nitride type compound semiconductor layers are grown on a thin insulating layer. This allows distortion at the interface to be minimized as compared with direct deposition of the gallium nitride type compound semiconductor layers over a conventional sapphire substrate. The single-crystal substrate is inexpensive and advantageous in machining process and will thus facilitate the production of devices.

The multilayer structure is composed mainly of the thick gallium nitride type compound semiconductor layers including cladding layers and the like and the insulating single-crystal silicon substrate, and will be cleft with ease having its light emitting surfaces mirror surfaces. This allows favorable production of semiconductor lasers for blue light.

According to the second to fourth aspects of the present invention, the substrate is not made of an insulating material and allows lower electrodes to be attached directly thereto. It is unnecessary to carry out a conventional etching process to expose corresponding regions of a conductive layer as the electrodes. Since such a dry etching process is eliminated, the overall procedure is simplified and deterioration caused by the resistance in the material quality caused by contamination during the etching process will be prevented.

Also, the semiconductor substrate is made of a gallium nitride type compound semiconductor similar to those of the relatively thick layers such as the cladding layers. As a result, the substrate and the layers are matched in crystal alignment and can thus be cleft with ease to specific mirror end surfaces. This allows production of semiconductor lasers for blue light.

Since the substrate is made of a gallium nitride type compound semiconductor which is the same kind as the operating layers. Hence, the substrate and the active layer are equal in the lattice constant thus producing lattice matching and minimizing lattice defect or dislocation. The quality of the semiconductor layers of the device will thus be enhanced by improving the efficiency of light emission and increasing the operation life.

According to the fourth aspect of the present invention, either ZnSe or ZnS of the substrate allows transmission of light without absorption of light of at least 470 nanometers wavelength or at least 320 nanometers wavelength respectively. When the light emitting device of the present invention produces light of which the wavelength is at most above-mentioned value, its operational efficiency will be particularly optimum.

By use of group III-V compound semiconductor material as a semiconductor substrate will be improved in performance when the substrate is made of gallium arsenide with the buffer layers containing gallium, of indium arsenide with the buffer layers containing indium, of gallium phosphide with the wavelength of at least 550 nanometers or the buffer layers containing gallium, or of indium phosphide with the buffer layers containing indium.

By use of group II-VI or group III-V compound material as the semiconductor substrate is employed to match in lattice constant of crystal structure, undesirable lattice defect or dislocation will be prevented. As a result, the quality of the semiconductor layers is enhanced thus improving the efficiency of light emission and increasing the operational life of the semiconductor light emitting device. The semiconductor layers can also be cleft with much ease giving fine mirror surfaces and implementing favorable semiconductor laser for blue light.

Though several embodiments of the present invention are described above, it is to be understood that the present invention is not limited only to the above-mentioned, various changes and modifications may be made in the invention without departing from the sprit and scope thereof.

What is claimed is:

1. A semiconductor light emitting device comprising gallium nitride type compound semiconductor layers stacked on a group III-V compound semiconductor substrate, wherein the group III-V compound semiconductor substrate is made of indium arsenide.

2. The semiconductor light emitting device of claim 1, wherein the gallium nitride type compound semiconductor layers are stacked on the group III-V compound semiconductor substrate having a principal plane, the principal plane being a top surface comprising group V atoms.

3. The semiconductor light emitting device of claim 1, wherein the gallium nitride type compound semiconductor layers are a plurality of layers including a p-type layer and an n-type layer and having an active layer for emission of light.

4. The semiconductor light emitting device of claim 1, wherein the gallium nitride type compound semiconductor layers comprises a buffer layer, a lower cladding layer, an active layer, an upper cladding layer, and a cap layer.

5. The semiconductor light emitting device of claim 4, wherein the buffer layer is made of n-type $Ga_wIn_{1-w}N$ ($0 < w \leq 1$), the lower cladding layer is made of n-type $Al_xGa_{1-x}N$ ($0 \leq x < 1$), the active layer is made of $Ga_nIn_{1-n}N$ ($0 < n \leq 1$), the upper cladding layer is made of p-type $Al_xGa_{1-x}N$ ($0 < x < 1$), and the cap layer is made of p-type GaN.

* * * * *

UNITED STATES PATENT AND TRADEMARK OFFICE
CERTIFICATE OF CORRECTION

PATENT NO.   : 6,087,681
DATED        : July 11, 2000
INVENTOR(S)  : Shakuda

Page 1 of 1

It is certified that error appears in the above-identified patent and that said Letters Patent is hereby corrected as shown below:

Item [30], please delete--196852/1994 Japan 08/08/94--, and insert 196852/1994 Japan 22/08/94.

Signed and Sealed this

Fourteenth Day of August, 2001

Attest:

Attesting Officer

NICHOLAS P. GODICI
*Acting Director of the United States Patent and Trademark Office*